(12) United States Patent
Savicki, Jr.

(10) Patent No.: US 7,497,582 B1
(45) Date of Patent: Mar. 3, 2009

(54) POWER CONTROL DEVICE AND HEAT SINK

(75) Inventor: Gerald R. Savicki, Jr., Canastota, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 0 days.

(21) Appl. No.: 11/343,102

(22) Filed: Jan. 30, 2006

Related U.S. Application Data

(63) Continuation-in-part of application No. 29/237,222, filed on Aug. 26, 2005, and a continuation-in-part of application No. 10/726,173, filed on Dec. 2, 2003, now Pat. No. 7,213,932.

(51) Int. Cl.
*F21V 29/00* (2006.01)
*H01H 9/52* (2006.01)
*H01R 13/717* (2006.01)

(52) U.S. Cl. .......................... 362/95; 362/373; 200/317; 439/535

(58) Field of Classification Search .................. 362/85, 362/89, 800, 373, 294, 95; 200/330, 331, 200/16, 310, 313, 317; 439/490, 535
See application file for complete search history.

(56) References Cited

U.S. PATENT DOCUMENTS

| | | | | |
|---|---|---|---|---|
| 3,746,923 | A | * | 7/1973 | Spira et al. .................. 315/291 |
| 3,798,506 | A | * | 3/1974 | English ....................... 361/704 |
| 4,329,678 | A | * | 5/1982 | Hatfield .................. 340/310.12 |
| 4,880,950 | A | | 11/1989 | Carson et al. |
| 4,924,349 | A | * | 5/1990 | Buehler et al. ............... 361/643 |
| 4,939,383 | A | | 7/1990 | Tucker et al. |
| RE33,504 | E | * | 12/1990 | Yuhasz et al. ................ 307/115 |
| 4,988,840 | A | * | 1/1991 | Carson et al. ................ 200/334 |
| 5,262,678 | A | | 11/1993 | Flowers et al. |
| 5,359,231 | A | | 10/1994 | Flowers et al. |
| 6,005,308 | A | | 12/1999 | Bryde et al. |
| 6,259,351 | B1 | * | 7/2001 | Radosavljevic et al. ..... 338/176 |
| 7,332,683 | B2 | * | 2/2008 | Gorman .................... 200/51.11 |

* cited by examiner

*Primary Examiner*—Stephen F. Husar
*Assistant Examiner*—Peggy A. Neils
(74) *Attorney, Agent, or Firm*—Daniel P. Malley; Bond, Schoeneck & King, PLLC

(57) ABSTRACT

The present invention is directed to a device for adjustably providing power to at least one electrical load. The device includes a rear body member and a plurality of terminals configured to be coupled to a source of the power and at least one load. A power control circuit is disposed in the body member and coupled between the plurality of terminals and the at least one electrical load. The power control circuit includes at least one variable control mechanism coupled to at least one series pass element. The at least one series pass element is configured to provide power to the at least one electrical load in accordance with the at least one variable control mechanism setting. A frameless front cover assembly is connected to the body member. The frameless front cover assembly includes at least one switch mechanism coupled to the at least one variable control mechanism. The frameless front cover assembly has a raised rectangular form factor. A planar heat sink is disposed between the frameless front cover assembly and the rear body member. A ground tab is connected to the planar heat sink and configured to extend perpendicularly from an interior planar surface of the planar heat sink into the rear body member. The ground tab includes a ground terminal configured to accommodate a ground screw.

48 Claims, 13 Drawing Sheets

*CONVENTIONAL DEVICE*

*CONVENTIONAL DEVICE*

POWER CONTROL DEVICE AND HEAT SINK

CROSS-REFERENCE TO RELATED APPLICATIONS

This is a continuation-in-part of U.S. patent application Ser. No. 10/726,173 filed on Dec. 2, 2003 now U.S. Pat. No. 7,213,932 and U.S. patent application Ser. No. 29/237,222 filed on Aug. 26, 2005, the contents of which is relied upon and incorporated herein by reference in their entirety, and the benefit of priority under 35 U.S.C. §120 is hereby claimed.

BACKGROUND OF THE INVENTION

1. Field of the Invention

The present invention relates generally to electrical wiring devices, and particularly to power control wiring devices.

2. Technical Background

Power control devices allow a user to adjust the amount of current delivered to an electrical load, such as a light or a motor. When the electric load is a lighting device, the power control device is commonly referred to as a dimmer. If the power control device is configured to control a motor, such as a fan motor, the power control device is referred to as a motor speed controller. Motor speed controllers are also used to control the speed of machinery such as power tools, electric drills, chair lifts, stationary machinery, and other such variable speed motor driven elements.

The core component of the power control device is commonly referred to as a series pass element. The amount of current provided by the series pass element is varied by a user-actuated switch mechanism. The switch mechanism may be a continuously variable switch or a selector switch mechanism that selects from a predetermined number of discrete switch settings. The series pass element may be implemented using a solid state switch. The active switching element in a solid state switch may be a transistor, a MOSFET device, a gate turn-off device, or a thyristor device, such as silicon controlled rectifier (SCRs) or a triac device. When the series pass element in a fan speed control device is a variable impedance, the power control device is commonly referred to as a "dehummer."

As those of ordinary skill in the art will appreciate, power control devices are typically packaged in a wiring device form factor for installation in an outlet box. Of course, one or more of the power control devices described above may be disposed within the device housing. A unit equipped with both a fan motor and a lighting element, for example, may be controlled by a wiring device that includes both a dimmer and a fan speed control. The exterior of the wiring device includes either screw terminals or wire terminals for subsequent connection between the AC power source and the load. The wiring device form factor also provides a user accessible front face that is includes one or more switch mechanisms such as levers, dials, slide switches, and other such input control mechanisms that permit a user to vary the power to a load.

Prior to device installation, wiring from the AC power source and wiring to the load(s) are disposed inside the outlet box. The outlet box is usually located proximate to the load being controlled. The device is installed by connecting the wiring inside the outlet box to the appropriate wiring device terminals disposed on the exterior of the wiring device. The power control wiring device is then inserted into the outlet box and attached to the outlet box using one or more fasteners. A cover plate is installed to complete the installation.

Some of the drawbacks associated with conventional power control devices are illustrated by referring to FIG. 1. Conventional device 10 includes a dimmer control knob 12 and switch 14 disposed in a protective frame 16. The protective frame 16 is coupled to mounting strap 20. The frame 16 functions as an alignment mechanism for the cover plate (not shown). The frame 16 extends through the cover plate opening when the device installation is complete. The mounting strap 20 is hidden behind the cover plate. The series pass element is typically implemented using a solid state device such as a triac. The mounting strap is then coupled to the triac and functions as a heat sink.

FIG. 2 shows a top view of the conventional mounting strap depicted in FIG. 1. Mounting strap 20 includes two major portions. The first portion is an exterior perimeter formed by tabs 22 and mounting end portions 28. The exterior perimeter surrounds an interior portion 26. One disadvantageous aspect of this design relates to the fact that the exterior perimeter portion (22, 28) and the interior portion 26 are not coplanar. Interior portion 26 is stepped downwardly to create space for the control knob 12 and switch 14. Interior portion 26 serves to thermally isolate mounting strap 20 from front surfaces of the power control device 10. The mounting strap is scored along lines 24. The lines 24 allow installers to repeatedly bend and break off tabs 22 with a pair of pliers if the control device is installed in a multi-gang wall box adjacent to other wiring devices.

One drawback associated with this approach is that the tabs 22 are only connected to end tabs 28 and cannot be connected to interior portion 26 because the design is not coplanar. The air gap between tabs 22 and interior portion 26 represents a major thermal discontinuity which greatly limits the thermal conductivity of the heat sink. Accordingly, the tabs afford minimal heat sinking benefit. Another drawback to this approach relates to the distance between wiring devices mounted in a multi-gang wall box being typically quite small. Tab removal allows the control device to fit in a multi-gang wall box but is disadvantageous because it diminishes the device's heat sinking capabilities. As a result, the power control device must be operated at a de-rated current level in order not to overheat the triac. The above scenario points to another shortcoming of conventional devices. Most conventional power control devices are functionally limited such that multi-gang wall boxes accommodate the assortment of wiring devices required to meet the user's functional requirements.

Another shortcoming of the conventional design also relates to the bi-level design of the mounting strap. In particular, the interior portion 26 encroaches into the interior volume behind the mounting strap 20 that is normally reserved for component placement necessitating an increase in the overall depth of the device. A thicker device is more difficult to install because there is less room in the electrical box for wiring and wire connections.

The heat sink also functions as the device mounting strap. Thus, another issue related to conventional power device heat sinks relates to its connection to the ground terminal. Many devices are wire terminal devices coupled to ground by using a ground wire. One drawback to this approach is that the wire connection to the heat sink occupies too much space within the device, making the over-all device form factor too bulky. Devices that employ ground screw terminals have other issues that are similar to some of the issues discussed above. One approach in forming a ground terminal is to bend one of the tabs 22 (or portion thereof) downwardly to form a screw terminal. A drawback associated with this approach is that the tab would lie outside the outlet box. Another approach is to bend a section of an end portion 28 downwardly such as along dotted line 25 so that the tab lies inside the outlet box. Of course, a tab 22 would have to be eliminated. A drawback to this approach relates to the fact that the over-all surface area used for device cooling is reduced. Yet another drawback related to the ground connection relates to the conduction of too much heat through the ground connection. If the temperature of the ground terminal is excessive, the ground wire insulation or other insulation in vicinity of the ground wire may be compromised, and a fire hazard may be created.

What is needed is a power control device equipped with a heat sink wherein the side tabs do not diminish the thermal conduction capabilities of the heat sink. A planar heat sink having an increased cross-sectional are is also needed to provide improved thermal conduction. Finally, a power control device is needed that has a thermally efficient screw terminal connection that eliminates the drawbacks associated with conventional designs.

SUMMARY OF THE INVENTION

The present invention addresses the needs described above by providing a power control device equipped with a heat sink wherein the side tabs do not diminish the thermal conduction capabilities of the heat sink. The planar heat sink has a thermally efficient screw terminal connection that eliminates the drawbacks associated with conventional designs.

One aspect of the present invention is directed to a device for adjustably providing power to at least one electrical load. The device includes a rear body member and a plurality of terminals configured to be coupled to a source of the power and at least one load. A power control circuit is disposed in the body member and coupled between the plurality of terminals and the at least one electrical load. The power control circuit includes at least one variable control mechanism coupled to at least one series pass element. The at least one series pass element is configured to provide power to the at least one electrical load in accordance with the at least one variable control mechanism setting. A front cover assembly is connected to the body member. The front cover assembly includes at least one switch mechanism coupled to the at least one variable control mechanism. A heat sink is disposed between the front cover assembly and the rear body member. A ground tab is connected to the heat sink and configured to extend in a direction substantially normal to an interior planar surface of the heat sink into the rear body member. The ground tab includes a ground terminal configured to accommodate a ground screw.

In another aspect, the present invention is directed to a device for adjustably providing power to at least one electrical load. The device includes a rear body member and a plurality of terminals configured to be coupled to a source of the power and at least one load. A power control circuit is disposed in the body member and coupled between the plurality of terminals and the at least one electrical load. The power control circuit includes at least one variable control mechanism coupled to at least one series pass element. The at least one series pass element being configured to provide power to the at least one electrical load in accordance with the at least one variable control mechanism setting. A front cover assembly is connected to the body member. The front cover assembly includes at least one switch mechanism coupled to the at least one variable control mechanism and a modular lamp assembly. A heat sink is disposed between the front cover assembly and the rear body member. A ground tab is connected to the heat sink and configured to extend in a direction substantially normal to an interior planar surface of the heat sink into the rear body member. The ground tab includes a ground terminal configured to accommodate a ground screw.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
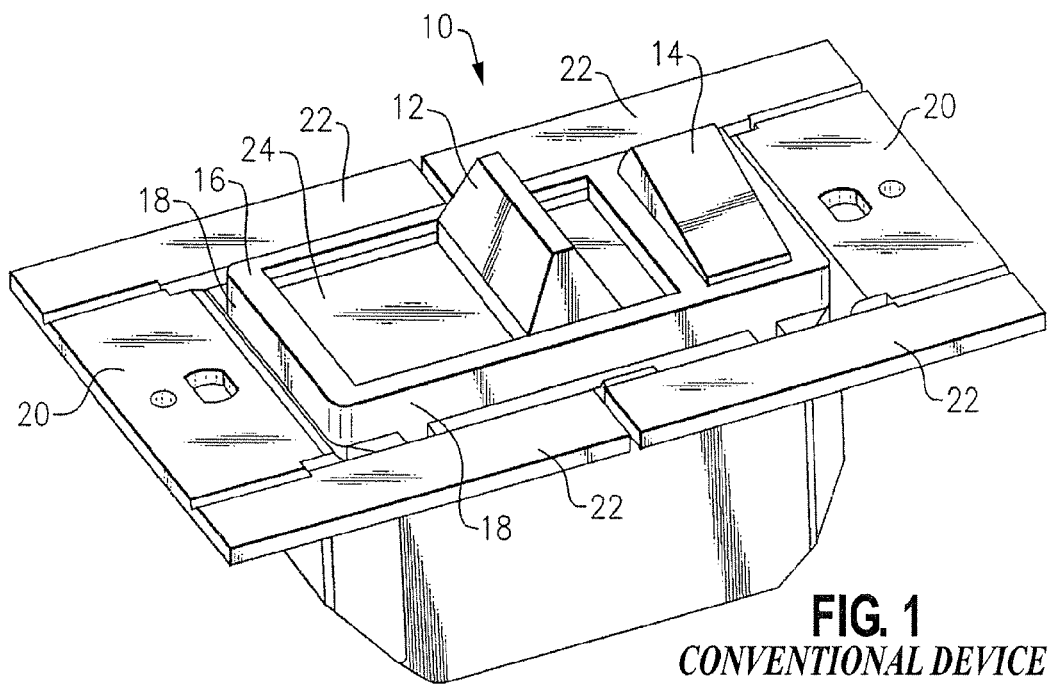
FIG. 1 is a perspective view of a conventional power control device.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the power control device of the present invention is shown in FIG. 3A, and is designated generally throughout by reference numeral 100.

In accordance with the invention, the present invention is directed to a device for adjustably providing power to at least one electrical load. The device includes a rear body member and a plurality of terminals configured to be coupled to a source of the power and at least one load. A power control circuit is disposed in the body member and coupled between the plurality of terminals and the at least one electrical load. The power control circuit includes at least one variable control mechanism coupled to at least one series pass element. The at least one series pass element is configured to provide power to the at least one electrical load in accordance with the at least one variable control mechanism setting. A frameless front cover assembly is connected to the body member. The frameless front cover assembly includes at least one switch mechanism coupled to the at least one variable control mechanism. The frameless front cover assembly has a raised rectangular form factor. A planar heat sink is disposed between the frameless front cover assembly and the rear body member. A ground tab is connected to the planar heat sink and configured to extend perpendicularly from an interior planar surface of the planar heat into the rear body member. The ground tab includes a ground terminal configured to accommodate a ground screw.

Figure 3A:
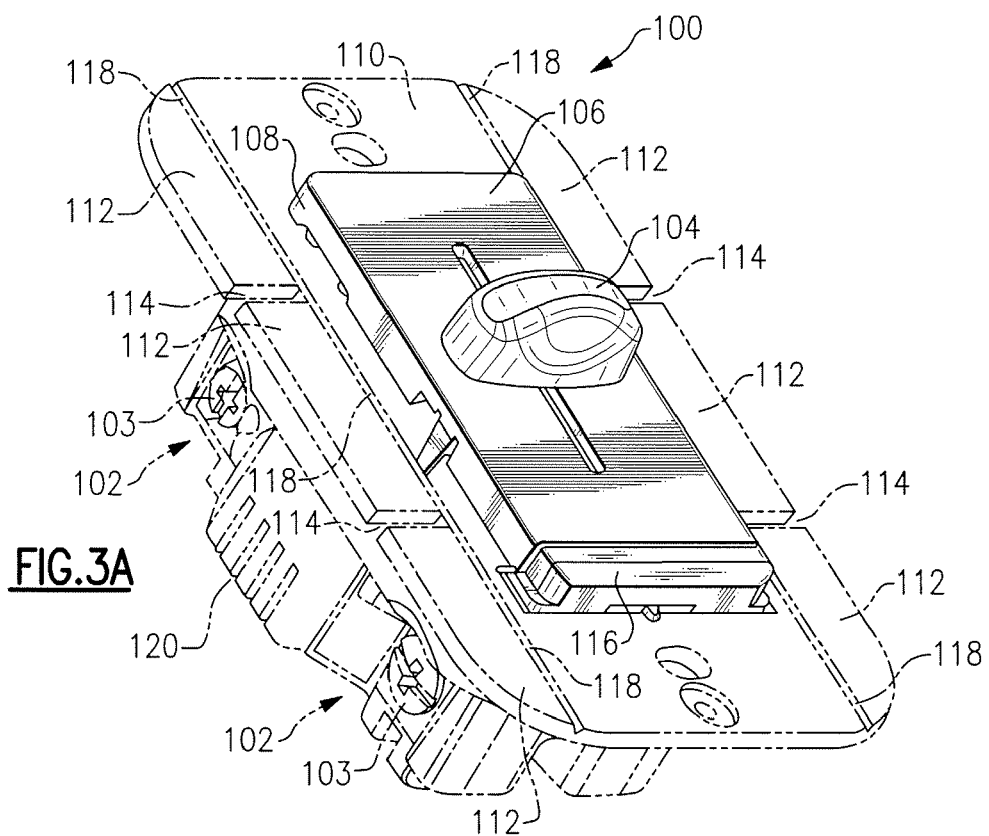
FIG. 3A is a perspective view of a power control device in accordance with a first embodiment of the present invention.

As embodied herein and depicted in FIG. 3A, a perspective view of a first embodiment of the power control device is shown. Device 100 includes a mounting strap 110, which functions as the device heat sink, coupled between a user accessible front cover portion 106 and device body member 120. A light module 116 is disposed between cover member 106 and an end portion of front cover portion 106. Device 100 includes screw terminals 102 which are provided to connect device 100 to both the voltage source and the load. A control knob 104 is disposed on the user accessible cover member 106 and is employed to adjust the power delivered to the load.

Power control device 100 may include a light module 116. Light module 116 may be configured to emit light when the control knob 104 is in the full OFF position. In this embodiment, lamp 116 operates as a locator for power control device 100 such that device 100 may be located by a user in a darkened room. In an alternate embodiment, lamp 116 serves as a pilot light, emitting light when power control device 100 is not in the fully OFF position. A pilot light allows the user to identify the power control device that is in use. Lamp module 116 includes a circuit that results in a steady light emission or, alternatively, that results in a blinking light emission, occurring during an intended circumstance for light emission such as has been described. In another embodiment of the present invention, lamp 116 is a removable lamp module.

In yet another embodiment, the removable lamp module may be replaced by a blank member. The blank member allows the power control device 100 to be reconfigurable from an illuminated device to a non-illuminated device, and vice-versa, in accordance with the user's requirements. Reference is made to U.S. patent application Ser. No. 10/726,173 and U.S. patent application Ser. No. 10/726,128 which are incorporated herein by reference as though fully set forth in its entirety, for a more detailed explanation of a lamp module, a removable lamp module and the blank member.

Figure 3B:
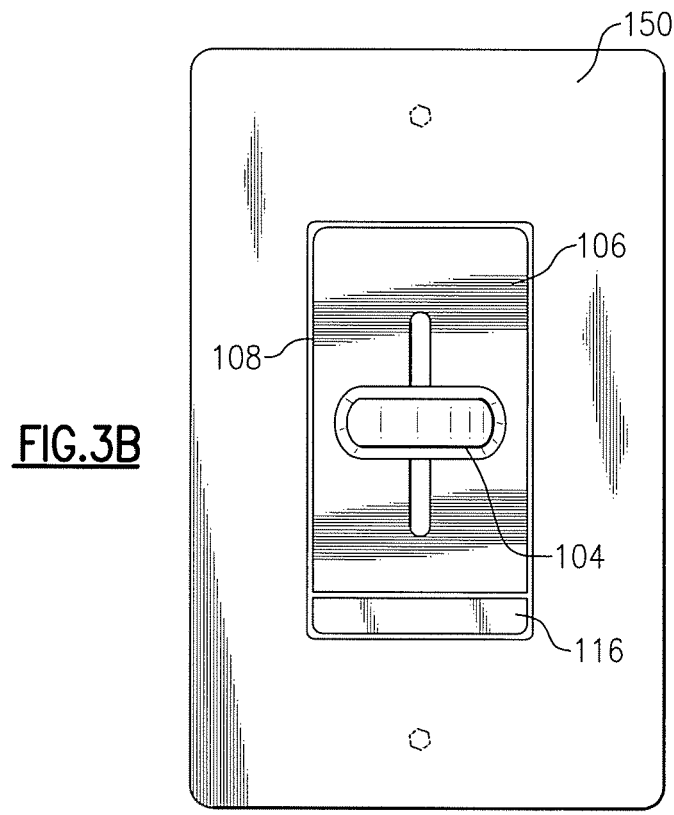
FIG. 3B is a plan view of the power control device depicted in FIG. 3A disposed in a standard wall plate.

FIG. 3B is a plan view of the power control device depicted in FIG. 3A disposed in a standard wall plate 150. In particular, the frameless front cover member 106 has a raised rectangular form factor, as evidenced by raised edge 108, that substantially corresponds to the standard wall plate opening and extends therethrough. The transverse dimension of frameless front cover member 106 is substantially equal to the transverse dimension of the standard wall plate opening. The gap between wall plate 150 and cover member 106 is slightly exaggerated in FIG. 3B. The planar surface of member 106 is approximately flush with the exposed surface of the wall plate. Accordingly, the cover plate cannot interfere with actuation of control knob 104. Furthermore, there are no inaccessible crevices or recessed surfaces that inhibit cleaning. The term "standard wall plate" is defined herein as a wall plate that conforms with the dimensions provided by the ANSI/NEMA WD6 standard.

Figure 4:
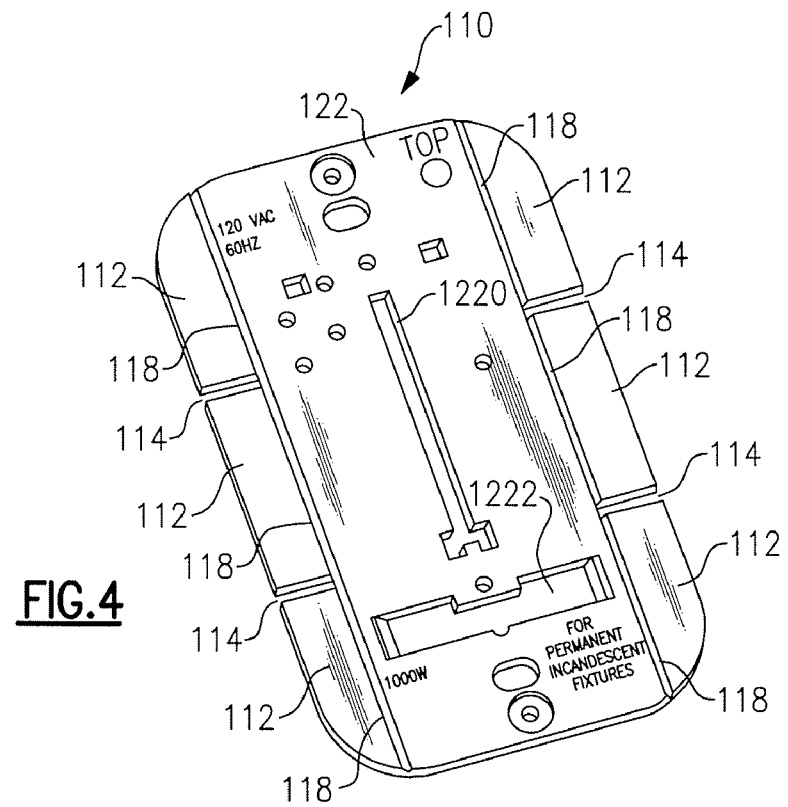
FIG. 4 is a top view of a heat sink mounting strap depicted in FIG. 3A.

Referring to FIG. 4, a top view of a heat sink mounting strap 110 depicted in FIG. 3A is shown. Heat sink 110 is planar, avoiding the disadvantages associated with certain conventional heat sinks. Heat sink 110 includes a plurality of removable tab members 112 connected to central heat sink portion 122. Central portion 122 includes a control knob aperture 1220 and a lamp assembly aperture 1222. An upset line 118 extends along each longitudinal side of heat sink 110 separating interior portion 122 from removable tabs 112. Upsets 118 may be implemented using scored lines, perforations, notches, and/or similar features. Tabs 112 are segmented by forming linear gaps 114 extending between the longitudinal edges of the heat sink and upset lines 118. Because the arrangement does not include any longitudinal gaps between central portion 122 and tabs 112, thermal conductivity is only marginally impacted. At the same time, the design allows the tabs 112 to be easily removed when tab removal is a necessity. Of course, those of ordinary skill in the art will understand that the heat generated by solid state devices, such as a triac, is more readily dissipated if the tabs 112 are not removed.

Figure 2:
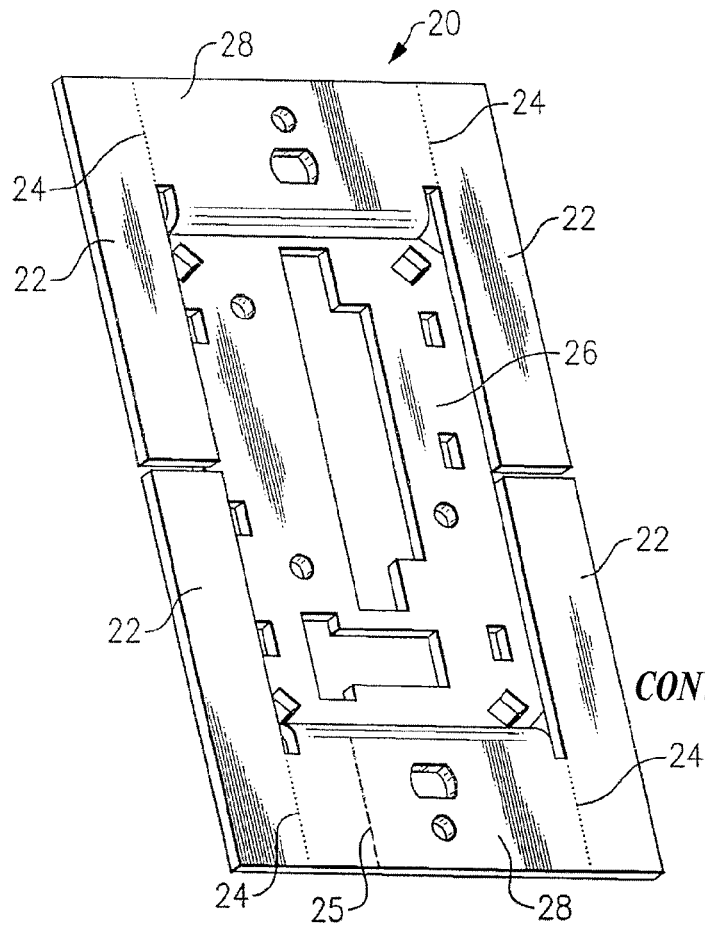
FIG. 2 is a plan view of a mounting strap employed in the conventional power control device.

The conventional heat sink shown in FIG. 2 is non-planar and is characterized by a thickness that is approximately equal to 0.062 inches. Those of ordinary skill in the art understand that thermal conductivity is a function of both the cross-sectional thickness of the heat sink, as well as the material used to implement the heat sink. Thinner heat sinks may result in hot spots during operation that must be isolated from device components. The depth of the conventional device from the heat sink to a major rear surface of the device is typically greater than 1.40 inches to provide the necessary isolation. On the other hand, the heat sink 110 of the present invention has a thickness within an approximate range between 0.080 and 0.10 inches. The combination of the increased cross-sectional area, i.e., thickness, the planar heat sink configuration, and the increased planar surface area provided by the tab 112 arrangement, contributes to a heat sink that exhibits a surface temperature that is more evenly distributed and peak temperatures that are less severe. Accordingly, the air space required to thermally isolate device components may be reduced. Also, the planar heat sink of the present invention does not have a downwardly stepped interior portion (see FIG. 2). This translates to a reduction in the distance required between the heat sink 110 and the interior rear surface of the housing 120 to approximately 1.20 inches.

Figure 5:
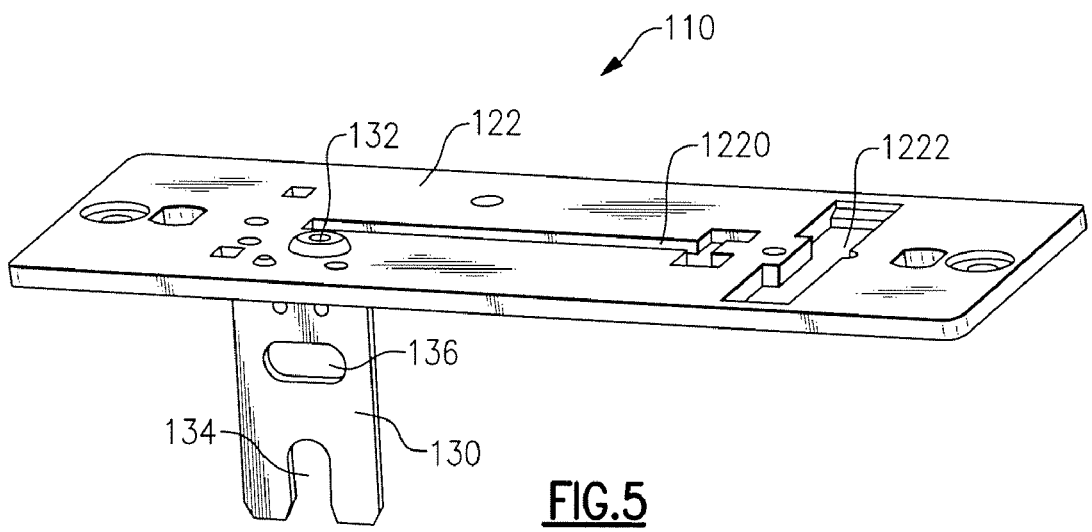
FIG. 5 is a side perspective view of the heat sink assembly depicted in FIG. 4.

Referring to FIG. 5, a side perspective view of the heat sink assembly 110 depicted in FIG. 4 is shown. In this view, tabs 112 are shown as being removed for clarity of illustration. Heat sink assembly 110 includes a ground tab 130 connected to the planar heat sink 122 by a rivet 132. Ground tab 130 includes a terminal region 134 configured to accommodate a ground screw. As noted previously, limitations associated with conventional devices often result in the ground terminal connection becoming excessively hot. Ground tab 130 addresses the drawbacks associated with the conventional designs in several ways.

As noted above, in some conventional designs, a section of an end portion 28 is bent downwardly to form a screw terminal. The drawback associated with this approach relates to the fact that a tab 22 must be removed. Consequently the over-all surface area used for device cooling is reduced. The inclusion of ground tab 130 in the present invention eliminates this drawback. The two-piece-construction of ground tab 130 also eliminates the amount of heat transmitted to the ground terminal by reducing the thermal conductivity of the ground tab 130 relative to the heat sink 122 itself.

Ground tab 130 may have a lower thermal conductivity by reducing the cross-sectional area of the ground tab. Thus, while the material employed to fabricate heat sink 122 and ground tab 130 may have identical, or similar, heat conduction properties, the reduction in cross-sectional area will result in lower thermal conductivity. The cross-sectional area may also be reduced by the inclusion of slot 136 in ground tab 130. On the other hand, a similar result may be obtained by selecting a ground tab material that has a comparatively greater thermal resistivity than the heat sink material. The use of dissimilar materials will also prevent excessive thermal energy from being conducted to the ground wire. In one embodiment, ground tab 130 is made out of steel whereas heat sink 122 is made out of aluminum. Accordingly, the heat sink 122 may operate at a maximum temperature of approximately 80° C., whereas the ground tab's thermal resistance limits the ground terminal temperature to about 60° C. This arrangement prevents the temperature applied to the ground wire insulation from exceeding a safe level.

Those of ordinary skill in the art will understand that heat sink 122 may be connected to ground tab 130 by any suitable means including, but not limited to, welding, braising, soldering, gluing, interference fitting, and press-fitting.

Figure 6:
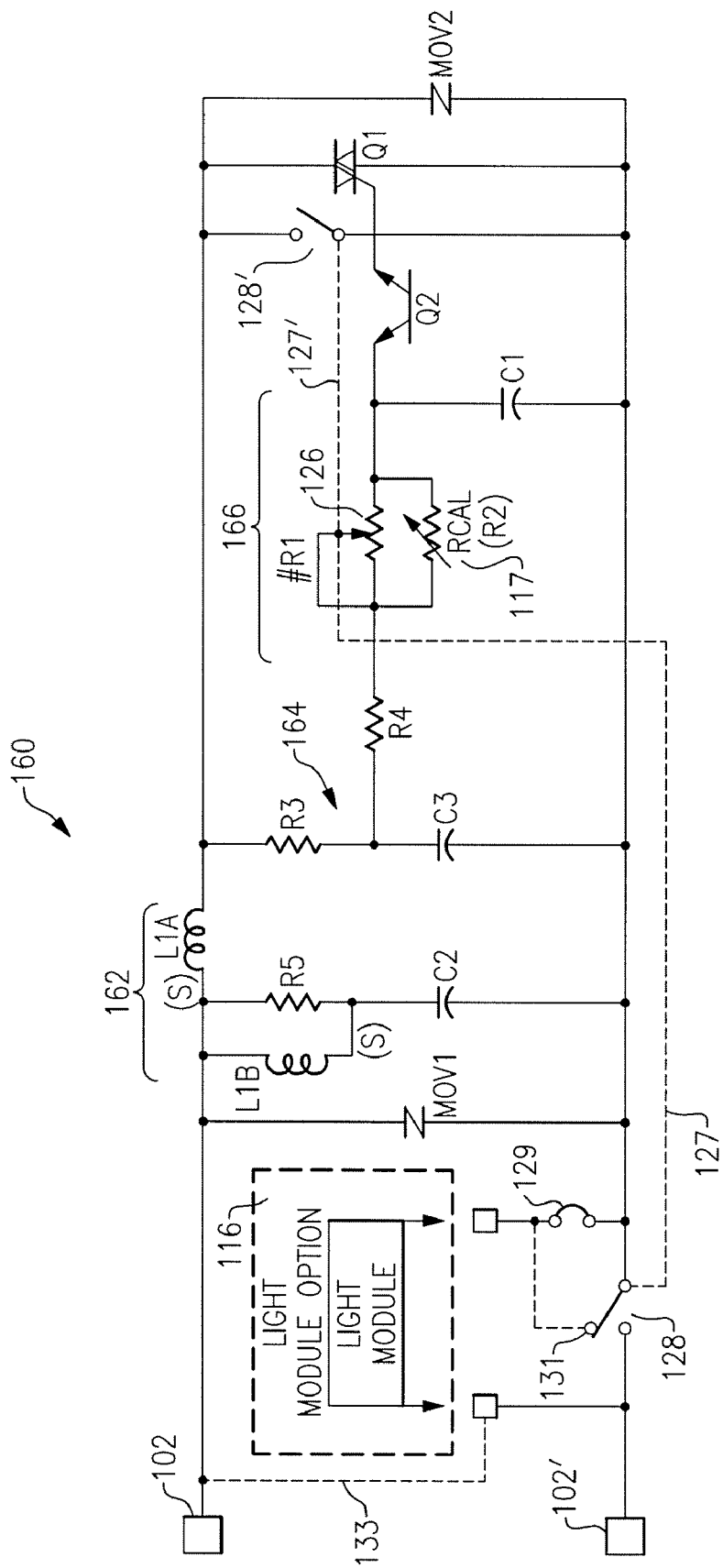
FIG. 6 is a schematic diagram of the power control device shown in FIG. 3A.

As embodied herein and depicted in FIG. 6, a schematic diagram for the power control device depicted in FIG. 3A is shown. The device is connected to the electrical distribution system by connecting the load between the hot line and terminal 102. Terminal 102' is connected to the return line. Light module 116 is configured to visibly display an operative condition of the power control device. As is shown by way of example in FIG. 3, lamp module 116 is connected in series with terminal 102'. Lamp module 116 is disposed in series with the series pass element 161. and in parallel with control switch 128. Control switch 128 is operatively coupled to adjustable element R1. The coupling is denoted by dotted line 127. Of course, light module 116 is OFF when switch 128 is in the closed position and ON when switch 128 is in the open position. Control switch 128 is configured to close when adjustable element R1 is adjusted for maximum (or near maximum) current through series pass element Q1. This type of switch is known as a "full-on switch" or "full-on bypass switch." A purpose of the full-on switch is to operate the light module as a nightlight as will be explained.

In an alternate embodiment control switch 128 is configured to open when the reset element is adjusted for minimum (or near minimum) current through series pass element Q1. This type of switch is known as an air gap switch or a slide-to-off switch. An air gap switch ensures that there is little or no electrical current to the load that could shock someone when they are changing a light included in the load. Preferably this current level is less than 0.5 mA. This current level is too low to activate the load. The term "control switch" as used herein, is a switch that is disposed in series with the power control load that operates in response to the adjustment of the variable control mechanism.

Contact 131 of control switch 128 can be omitted to simplify or reduce the cost of assembly by employing jumper 129. Jumper 129 may be implemented using any suitable means, such as a solder bridge, removable conductor, attachable conductor, or as an insertable conductor. In one embodiment, jumper 129 is an electrically conductive material inserted in the hole of a printed circuit board. The insertion connects circuitry together disposed on either side of the board. In other embodiments of the invention to be described, jumper 129 is omitted and the control switch functions as a single-pole double-throw switch.

In another embodiment, light module 116 is coupled across switching element Q1 as shown by dotted line 133. The amount of light emitted by light module 116 is in inverse relation to the power level to the load. Given the inverse relationship, the lamp module serves as a locating aid for helping to locate the power control device in an otherwise darkened room.

Power control device 100 may be susceptible to damage when an overvoltage condition exceeds about a 1,000 Volts. As those of ordinary skill in the art will appreciate, overvoltages may be caused by switching transients that occur when a load on the electric circuit is turned ON or OFF. Overvoltage conditions may also be generated by lightning induced transients. Accordingly, a metal oxide varistor MOV1 is disposed between terminal 102 and terminal 102' to protect device 100 from such overvoltage conditions that may occur from time to time. MOV 1 protects the device 100 by clamping the transient voltage to a safe level, i.e., less than about 500 Volts.

Device 100 also includes an RFI filter block 162 that is configured to eliminate high frequency noise generated by series pass element Q1. RFI filter 162 includes inductors L1A, L1B, resistor R5, and capacitor C2. The functionality of filter 164 will become clearer in the discussion provided below. RC filter circuit 164 strips off random high frequency transients that are propagating in the electrical circuit. Filtering is implemented by resistor R3, R4, and C3. RC circuit 164 also phase shifts the input signal by a predetermined phase angle.

The power applied to series pass element Q1 is regulated by the variable control mechanism 166, which is implemented using potentiometer 126 (R1), trim adjustment resistor 117 (R2), resistor R4 and capacitor C1. The variable control mechanism 166 is adjusted by the user by way of the control knob switch 104 (See FIG. 2A). Of course, potentiometer 126 is the adjustable element R1 in circuit 166. An RC circuit, such as the one implemented by potentiometer 126, resistor R4, and C1, may be characterized by a time constant (T). In this case, time constant T corresponds to a delay between the zero-crossing of the AC signal and the firing angle of the circuit. In other words, circuit 166 is configured to turn transistor Q2 ON at a predetermined point during the AC cycle. Transistor Q2 works in concert with capacitors C1 and/or C3 in providing triac Q1 with a current high enough to turn triac Q1 ON. Thus, circuit 166 is configured to drive Q1 to cycle the power to the load ON and OFF a predetermined number of times during each AC cycle.

Trim adjustment resistor 117 is discussed in greater detail in the embodiment depicted in FIG. 8A. Suffice it to say at this point that trim resistor 117 may be used to calibrate device 100 to a fan motor or adjust the minimum light intensity provided by the dimmer.

Referring back to light module 116, those of ordinary skill in the art will understand that module circuit 116 may be configured such that the amount of light emitted by the lamp assembly is either unaffected by, or related to the percentage of time that current is being supplied by the power control device to the load. The relationship may be either a direct relationship or an inverse relationship. If there is a direct relationship, the lamp module serves to indicate the amount of power being provided to the load. If there is an inverse relationship, the lamp module serves as a locating aid for helping to locate the power device in an otherwise darkened room.

The functionality of MOV 1 was discussed above. MOV 1 may be of any suitable type, but there is shown by way of example a movistor that is about 12 mm in diameter, or larger. A movistor of this size is capable of absorbing the energy levels described previously. Other surge suppression devices, such as spark gaps, gas discharge devices, capacitors, and/or zener diodes may be used in combination with MOV 1. In alternate embodiments, the aforementioned other surge suppression devices may replace MOV 1 altogether.

In an alternate embodiment of the present invention, MOV 1 is omitted and MOV 2 is disposed across the series pass element. MOV 2 protects the series pass element and other components from overvoltage conditions. MOV 2 is in series with the RFI filter (L1A, L1B, C2, R5). Of course, with all things being equal, the amount of current propagating through MOV 2 is typically not as great as the current through MOV 1 due to the series impedance of the RFI filter. Since MOV 2 does not have to dissipate as much energy as MOV 1 due to the reduced current, MOV 2 may be a comparatively smaller than MOV 1. Accordingly, MOV 2 may be about 7 mm in diameter.

In yet another alternate embodiment, MOV 2 and MOV 1 may be used in combination. In this arrangement, MOV 2 protects the series pass element Q1 and other components, while MOV 1 protects components such as the RFI circuit.

Figure 7:
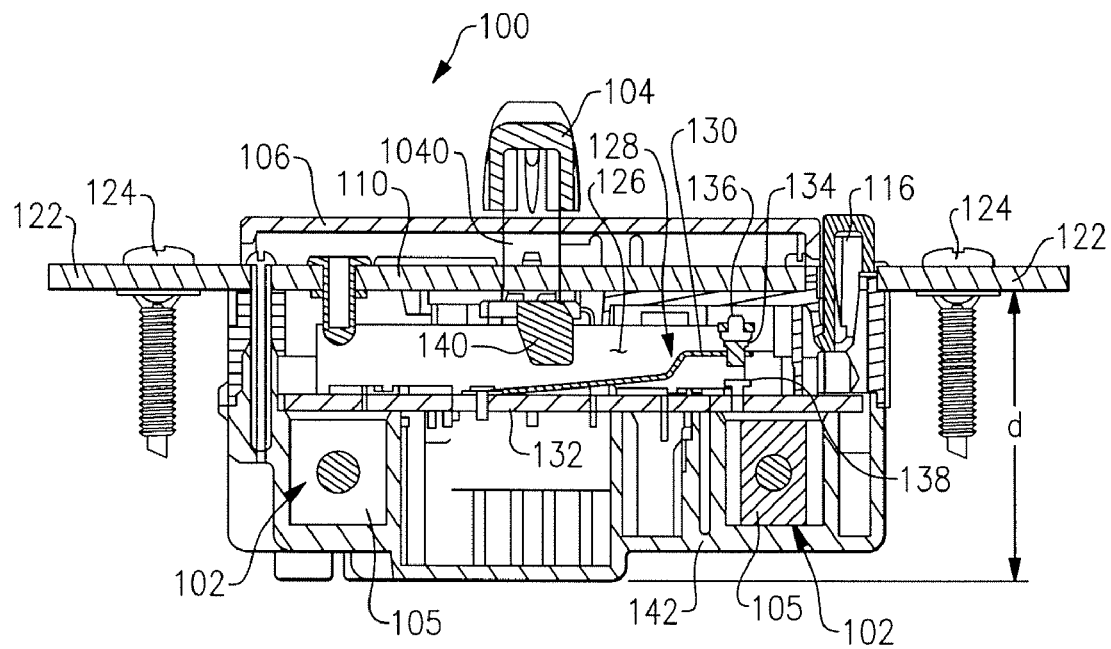
FIG. 7 is a cross-sectional side view of the power control device depicted in FIG. 3A.

Referring to FIG. 7, a cross-sectional view of the power control device depicted in FIG. 3A is shown. Dimmer control knob 104 is connected to a rectangular stem member 1040 that extends through a slot 124 formed in mounting strap/heat sink 110. The non-accessible end of the slide member 1040 is connected to switch actuator 140. Switch actuator 140 is configured to slide within potentiometer 126 to vary the displacement of slide switch 128. Control switch (slide switch) 128 includes cantilever beam 130 which is electrically connected to a printed circuit board 132. Slide switch 128 also includes contact 134 and fixed contacts 136 or 138. Fixed contacts 136, 138 are alternate embodiments that are discussed below.

If contact 136 is employed, cantilever beam 130 is pre-biased such that there is electrical connectivity between the cantilever beam and contact 136. When the user moves control knob 104 to the right, actuator 140 will eventually cause contacts 134 and 136 to separate. On the other hand, if the switch may employ contact 138. In this case, as control knob 104 is moved to the right, actuator 140 urges cantilever beam 130 to deflect toward contact 138 to establish electrical connectivity.

In an alternate embodiment, a second control switch (not shown) is disposed in device 100. The second control (slide) switch 128' is similar in structure to slide switch 128 except that it is oriented in the opposite direction. Whereas cantilever beam 130 deflects when actuator 140 is moved to the right, the cantilever beam included in control switch 128' deflects when actuator 140 moves to the left. The control switches serve to provide a full-on capability at one end of the potentiometer adjustment and full-off capability at the other end of the potentiometer adjustment. Switch 128' is coupled across switching element Q1 (see FIG. 3). Switch 128' is shown as coupled to adjustable element R1 by dotted line 127'.

The depth behind the mounting strap, represented by dimension "d" is the distance between the mounting strap and a rearward surface of rear body member 122. The dimension "d" is typically less than or equal to approximately 1.20 inches.

The cross-sectional view provided by FIG. 7 reveals that wiring terminals 102 may include screw terminals 103 (FIG. 3A) as well as pressure plates 105. Thus, device 100 may be connected to the electrical circuit by fastening the electrical wiring to terminals 102 by wrapping the wire around the shank of a terminal screw 103 and tightening the screw. Alternatively, the wire may be inserted between pressure plate 105 and the head of the terminal screw. Again, the screw is subsequently tightened causing the wire to be clamped by the plate and the screw head. Terminals 102 may also include a clip into which a wire is inserted. After inserted, the clip closes to fasten the wire to the terminal. Regardless of the method of connecting the electrical wiring to device 100, after the wiring is connected to the terminals 102, installation is completed by inserting fasteners 124 into apertures formed in the end portions 122 of strap 110.

Figure 8:
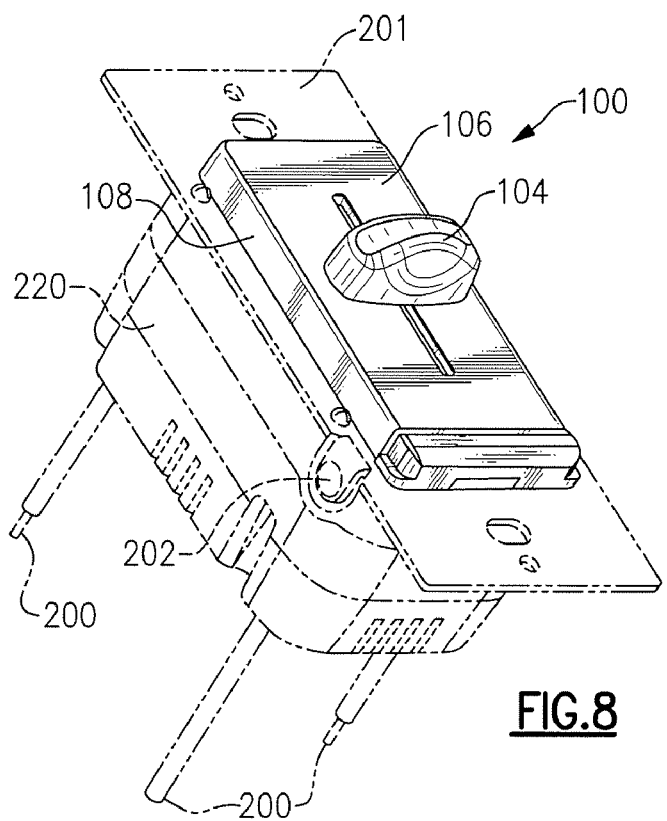
FIG. 8 is a perspective view of a power control device in accordance with a second embodiment of the present invention.

As embodied herein and depicted in FIG. 8, a perspective view of a second embodiment of the power control device 100 is shown. This embodiment is directed to a multi-position fan speed control device. Control knob 104 allows the user to select five discrete positions including OFF, LOW, MEDIUM, HIGH, and MAXIMUM. The body member 220 includes a greater interior volume than the body member 120 employed in FIG. 4. Note also that device 100 employs wire terminals 200 instead of the screw terminals provided in the first embodiment. The additional volume is required to accommodate the capacitors employed in the switching circuit (not shown). The mounting strap 201 employed in the second embodiment is similar to the heat sink 110 shown in FIG. 4. One notable exception is that mounting strap 201 does not include any removable tabs. A ground terminal 202 coupled to mounting strap 201 and disposed at an exterior location on body member 220 permits mounting strap 201 to be electrically connected to a ground wire. Since removable tabs 112 are not provided in this embodiment, ground terminal 202 may be disposed along any of the edges of mounting strap 201.

Figure 9:
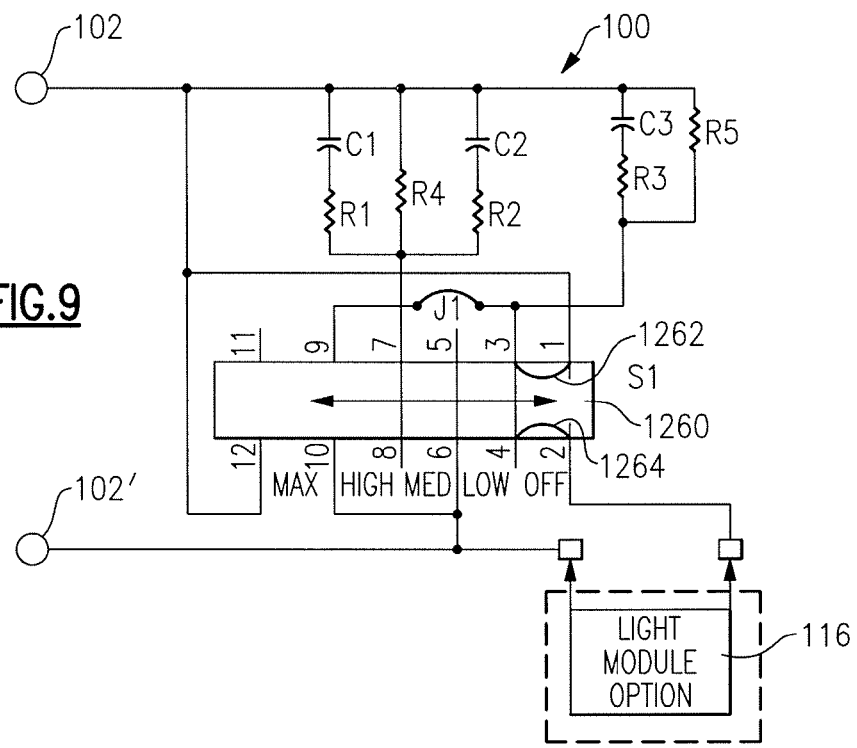
FIG. 9 is a schematic diagram of a fan speed control circuit in accordance with the embodiment depicted in FIG. 8.

Referring to FIG. 9, a schematic diagram of the multi-position fan speed control device depicted in FIG. 8 is shown. The device 100 is connected to the electrical distribution system via terminals (wires) 200. The fan motor load is coupled in series with device 100 to the source voltage of the electrical distribution system. The basis of this embodiment is discrete step switch element 1260 which is coupled to the control knob 104. Thus, control knob 104 may be employed by a user to select between any one of five positions including OFF, LOW, MED, HIGH, and MAX. As those of ordinary skill in the art will appreciate, switch element 1260 is the functional equivalent of the variable control circuit and is coupled to the series pass element. The series pass element is implemented by an RC circuit that includes capacitors C1, C2, C3.

The second embodiment of the present invention also includes a light module 116. Again, the light module 116 functions as a locator light. When switch 1260 is placed in the OFF position, current is applied to the light module 116. Light is thus emitted when device 100 is turned OFF. Thus, a person entering a darkened room may easily locate the control because the light emitted by module 116 functions as a location beacon.

Switch 1260 operates as follows. Control knob 104 is shown in the OFF position. In the OFF position, switch contacts 1 and 3 are shorted together by shorting structure 1262 and contacts 2 and 4 are shorted together by shorting structure 1264. As the switch is stepped from the OFF position to the MAX position, the bridging structures advance each time to short the next pair of adjacent terminals. When knob 104 is stepped all the way to the MAX position, contacts 9 and 11 are shorted together and contacts 10 and 12 are shorted together. At the MAX position, there is little or no impedance between terminals 200.

In an alternate embodiment, light module 116 is disposed across contacts 11 and 12 (not shown). When light module 116 is not emitting light, the user realizes that the fan is fully activated.

Figure 10:
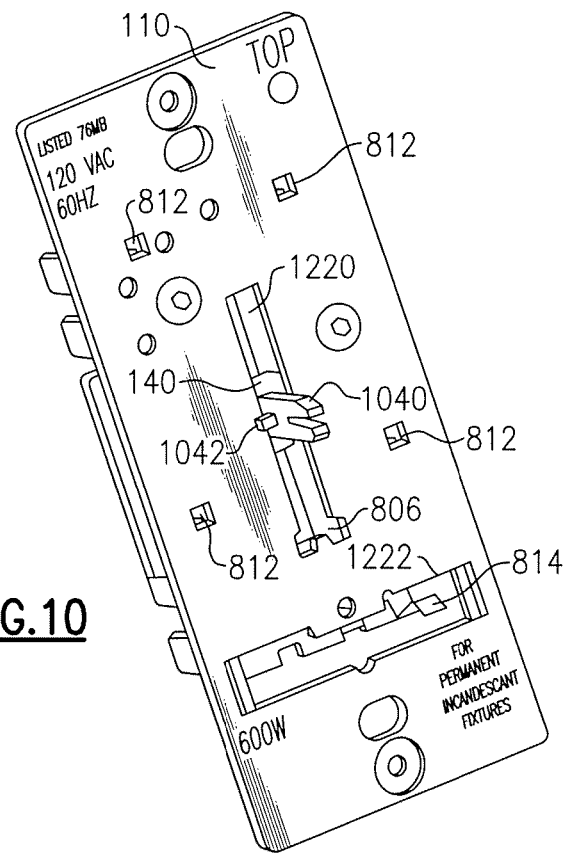
FIG. 10 is a perspective view of the mounting strap and control actuator interface depicted in FIG. 8.

Referring to FIG. 10, a detail view of the mounting strap and control actuator interface suitable for FIGS. 3-9 is shown. The user adjusts the amount of power delivered to the load by manipulating control knob 104. Control knob stem 1040 extends through slot 1220 to connected with switch actuator 140. Stabilizer element 1042 is disposed in a transverse direction relative to stem portion 1040. The stabilizer element 1042 facilitates the movement of actuator 140 along the longitudinal axis of slot 804. Stabilizer 1042 and switch actuator 140 limit the torquing motion when the control knob 104 is manipulated by the user. In the continuously variable embodiments of the present invention, a portion of actuator 140 slides within potentiometer 126. In the step-wise adjustable embodiment, control stem 1040 moves between the discrete positions provided by switch 1260.

Slot 1220 has an enlarged region 806 that permits switch actuator 140 and strap 110 to be assembled. A subsequent assembly step may add a barrier (not shown) that prevents switch actuator 140 from re-entering the enlarged region. In an alternate embodiment, the enlarged region may be omitted if the switch actuator 140 is disposed on one side of the mounting strap 110 and stabilizer 1042 is included.

Strap 110 also includes an opening 1222 that is configured to accommodate light module 116. Contact mechanism 814 is configured to engage the light module contact mechanism. If the user employs a blank module instead of a light module, contact mechanism 814 is covered by the blank module and not accessible to a user. The mounting strap 110 also includes holes 812 that accommodate the front cover snaps that are used to connect front cover 106 to the strap 110.

Figures 11A, 11B:
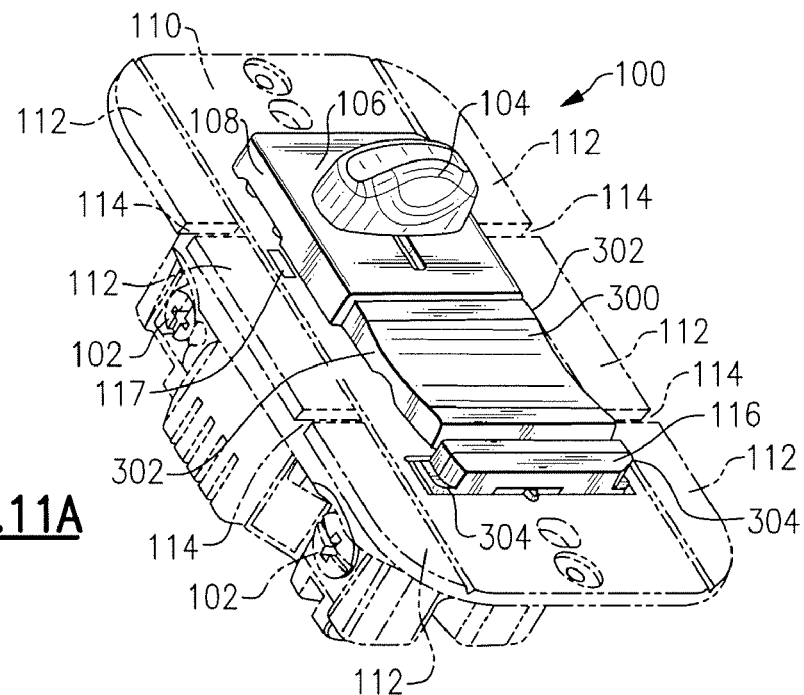
FIG. 11A is a perspective view of a power control device in accordance with a third embodiment of the present invention.
FIG. 11B is a plan view of the power control device depicted in FIG. 8A disposed in a standard wall plate.

As embodied herein and depicted in FIG. 11A, a perspective view of a power control device 110 in accordance with a third embodiment of the present invention is shown. In this embodiment, the self-aligning front cover member includes the dimmer switch front portion 106 and a switch element 300. Of course, the light module 116 is disposed under the switch element 300. Each of these elements (106, 300, 116) has a raised rectangular form factor that corresponds to a standard wall plate opening. Switch 300 also includes raised edges 302 that are configured to align with the raised edge of dimmer cover member 106 and light module 116. Raised edges 302, light module 116, and dimmer cover member 106 are configured to be flush, or slightly raised, relative to the surface of the cover plate 150.

Those of ordinary skill in the art will understand that control knob 104 may be coupled to either a continuously variable dimmer control or a variable speed fan control disposed in body member 120. Thus, switch control 106 may also be implemented as a multi-positional switch, such as a three way switch. The three-way switch may be configured to switch between an OFF position, an intermediate position, and a full ON position. The three way switch may be operatively coupled to the series pass element in the device and to a remote switch.

Switch 300 may be configured as a preset switch that is disposed in series with the variable speed dimmer or fan control. The preset switch provides device 100 with an ON/OFF control. The preset switch turns the dimmer ON at the last selected brightness level, or at a predetermined brightness level, eliminating the need for the user to find the desired setting every time the device is switched ON and OFF. This allows a user to keep control knob 104 in a desired position such that the user need only actuate switch 300 to cause device 100 to operate as it did during the last operation.

In another embodiment, switch 300 may be configured to provide ON/OFF control to a separate electrical load. Those skilled in the art understand that general purpose switches of this type that are typically employed in residential environments should be rated at either 15 Amperes or 20 Amperes, depending on the application. As shown, switch 300 toggles between positions disposed along the longitudinal axis of device 100. The directionality of switch toggling is advantageous because it avoids interference with any switches that may be disposed nearby. Alternatively, switch 300 may be configured to toggle in the transverse direction.

Device 100 includes a user accessible trim adjuster 117. Trim adjuster 117 is accessible to the user when the cover plate is removed. As noted previously, trim adjuster 117 provides a low end voltage adjustment that allows the user to set the minimum light intensity, or the minimum fan motor speed. Those of ordinary skill in the art will understand that certain electric motors tend to stall below a certain operating speed. Accordingly, trim adjuster 117 allows the user to calibrate device 100 to the fan motor. This feature may also be useful to adjust the minimum light intensity provided by the dimmer.

FIG. 11B is a plan view of the power control device depicted in FIG. 11A disposed in a standard wall plate 150. Again, the frameless front cover assembly has a raised rectangular form factor that closely fits into the cover plate 150 opening. The self-aligning front cover member includes the dimmer switch front portion 106 and a switch element 300. Each of these elements (106, 300, 116) has a raised rectangular form factor that corresponds to a standard wall plate opening. In other words, each of the aforementioned elements has a transverse dimension substantially equal to the transverse dimension of the standard wall plate opening.

The gap between wall plate 150 and cover member 106 is slightly exaggerated in FIG. 1B. The planar surface of member 106 and the raised portions 302 are flush with the exposed surface of the wall plate. Accordingly, the cover plate cannot interfere with the actuation of the control knob 104 or switch member 300. Furthermore, there are no inaccessible crevices or recessed surfaces that inhibit cleaning. Again, the term "standard wall plate" is defined herein as a wall plate that conforms with the dimensions provided by the ANSI/NEMA WD6 standard.

Figure 12:
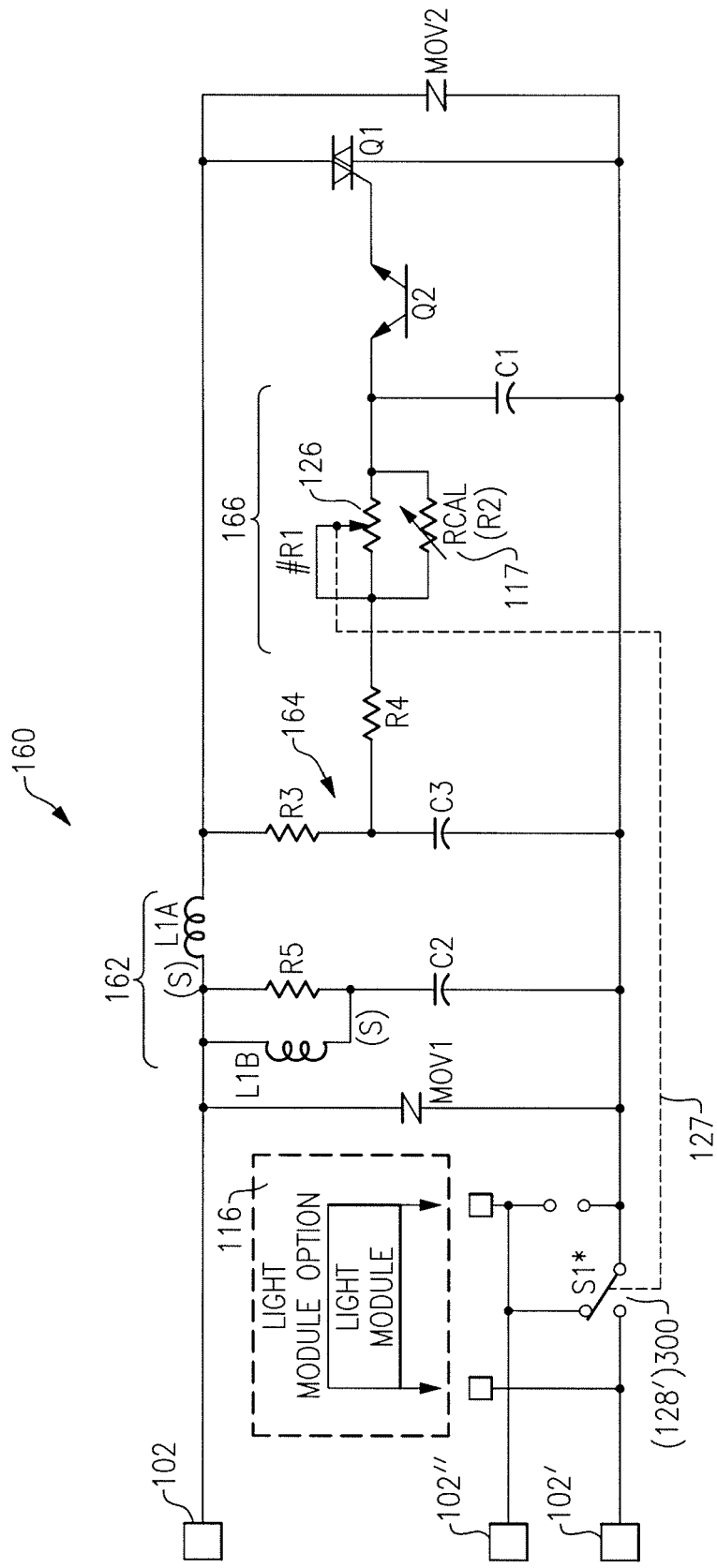
FIG. 12 is a schematic diagram of the power control device shown in FIG. 11A.

As embodied herein and depicted in FIG. 12, a schematic diagram for the power control device depicted in FIG. 11A is shown. The schematic diagram of FIG. 12 is almost identical to the diagram shown in FIG. 6. The exception is that a single-pole double-throw is included. In one embodiment, the single-pole double-throw switch is a control switch 128'. Control switch 128' is operatively coupled to adjustable element R1. The coupling is denoted by dotted line 127. Terminals 102' and 102" are electrically connected to fixed contacts 136 and 138 (see FIG. 4.) Also, terminals 102' and 102" are connected to like terminals in a remotely located switch. The two switches are interconnected to allow power to the load to be switched OFF and ON by either switch. This is commonly referred to as a three-way switching scheme. Light module 116 is coupled to switch 128' so as to emit light whenever power is not being provided to the load.

In an alternate embodiment, the single-pole double-pole switch is the preset switch 300. Of course, preset switch 300 and the adjustable element are independently operable, (dotted line 127 is omitted in this embodiment.)

The load is coupled to the source voltage by way of terminal 102 and one of terminals 102', 102" which are selected by operation of preset switch 300 (S1). In contrast to a control switch, a preset switch is not coupled to adjustable element R1. Dashed line 304 illustrates the connection between the preset switch 300 and potentiometer 126. Switch 300 is configured to turn the power control circuit 1600N or OFF. Light module 116 functions as a locator light element. When preset switch 300 is OFF the light module 116 is energized. If preset switch 300 is ON, the circuit is energized and light module 116 does not emit light.

Figure 13:
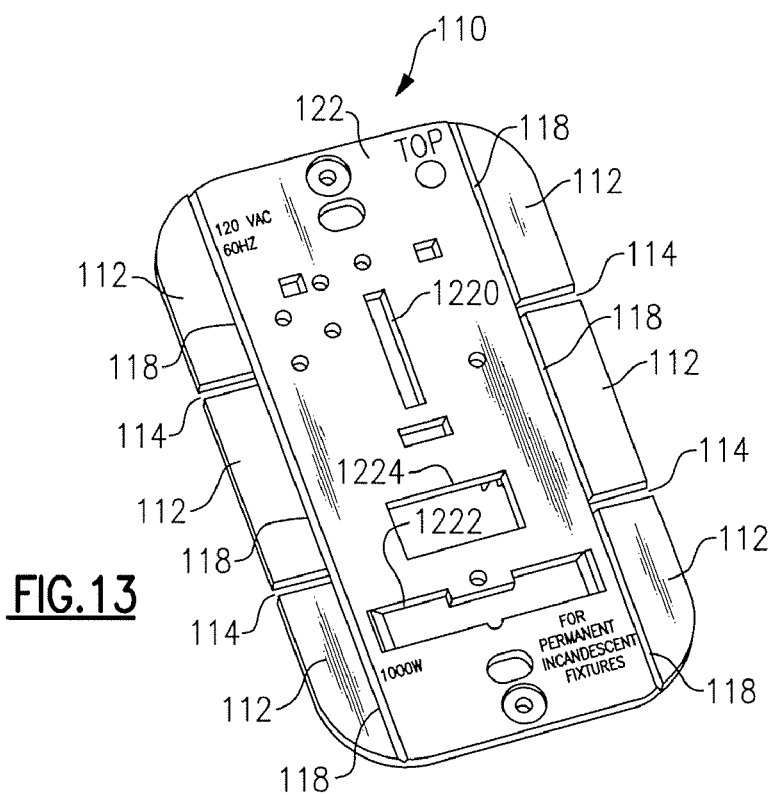
FIG. 13 is a top view of the heat sink mounting strap depicted in FIG. 11A.

As embodied herein and depicted in FIG. 13, a plan view of the heat sink 110 depicted in FIGS. 11-12 is shown. Like the heat sink member shown in FIGS. 4-5, all of the elements of heat sink 110 are disposed in a single plane. Heat sink 110 includes a central portion 122 that includes several apertures 1220, 1222, 1224 that are formed to accommodate the control knob stem 1040, switch 300, and light module 1116, respectively. An upset line 118 extends along each longitudinal side of heat sink 110 separating interior portion 122 from removable tabs 112. Tabs 112 are segmented by forming linear gaps 114 extending between the longitudinal edges of the heat sink and upset lines 118. Upsets 118 may be implemented using scored lines, perforations, notches, and/or similar features. Unlike conventional designs, there are no gaps along the longitudinal axis between heat sink 110 and tabs 112. The innovation results in superior thermal conductivity between portion 122 and tabs 112.

The segmented break-off tabs are easier to remove than a single tab disposed along the longitudinal edge of heat sink 110. Further, the segmented tabs allow for the removal of a single tab in the event that it is necessary to only remove a single tab from proper device installation. Accordingly, the remaining tabs are left in place to provide optimal heatsinking functionality.

It will be apparent to those of ordinary skill in the pertinent art that modifications and variations can be made to strap/heat sink 110 of the present invention depending on cost, manufacturability, and heat conduction characteristics. Accordingly, heat sink 110 may be fabricated using a conductive material such as aluminum or steel. The material may be plated, anodized, black anodized, or similarly processed.

Figure 14:
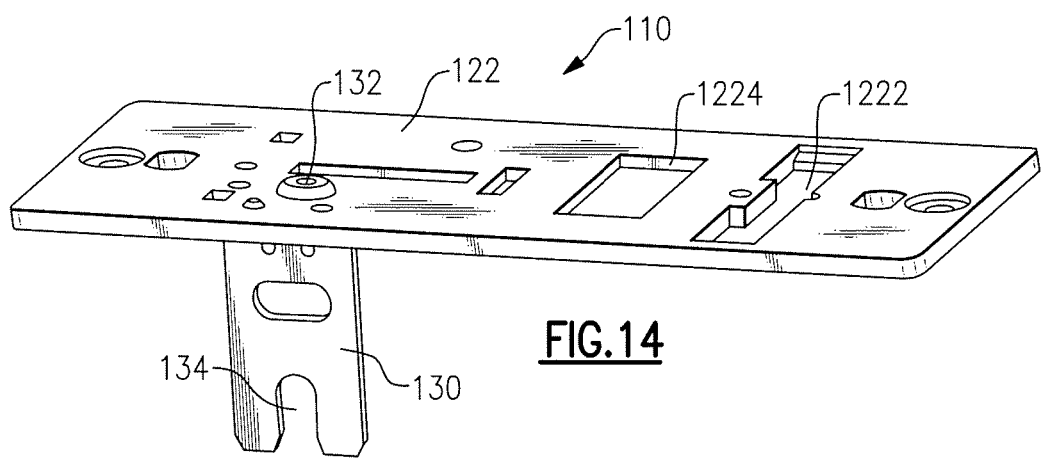
FIG. 14 is a side perspective view of the heat sink depicted in FIG. 13.

Referring to FIG. 14, a side perspective view of the heat sink assembly 110 depicted in FIG. 13 is shown. With the exception of aperture 1224, this embodiment is identical to the embodiment depicted in FIG. 5.

Figure 15:
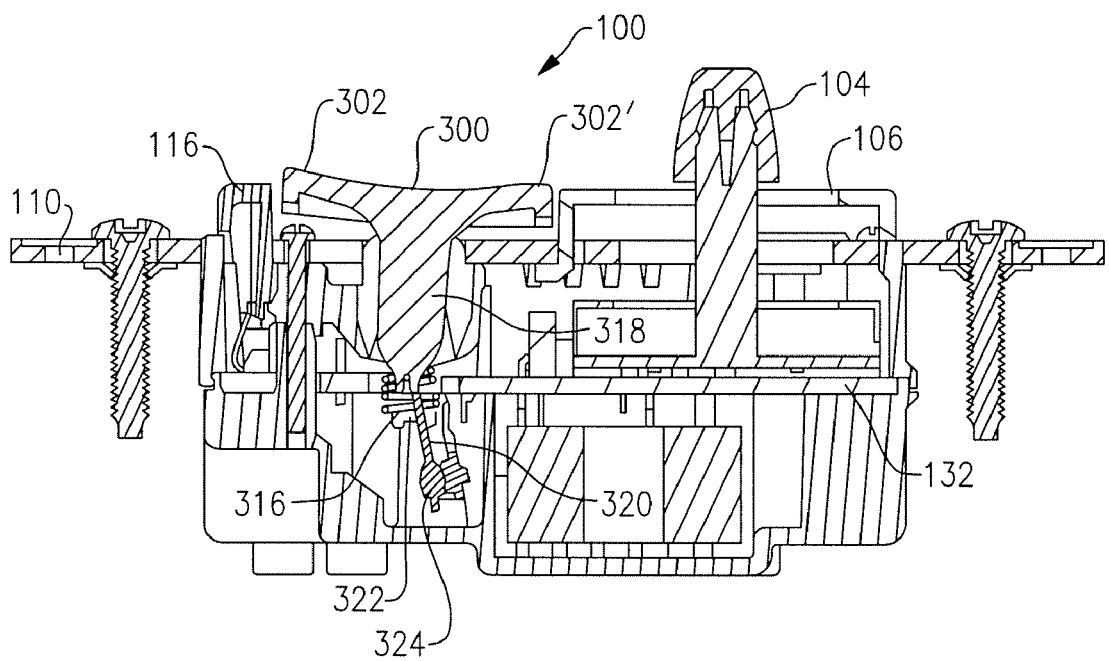
FIG. 15 is a cross-sectional view of the device shown in FIG. 11A.

Referring to FIG. 15, a cross-sectional view of the device 100 depicted in FIG. 11A is shown. The dimmer portion 106 disposed adjacent to the switch button 300 is a smaller version of the dimmer switch fully described above.

The preset switch 300 toggles between an ON position and an OFF position represented by raised surfaces 302, 302'. Raised surfaces 302, 302' are used to actuate the switch between the two positions. Those of ordinary skill in the art will understand that switch 310 may be implemented using any suitable form factor that provides the user with the ability to toggle between the two positions. For example, switch 310 may be in the shape of a lever (not shown) wherein the two tactile surfaces are disposed on opposite sides of the lever. Switch 310 may be a push button switch. In this embodiment, each depression of the push button toggles the switch from one position into the other.

Switch 300 includes an actuator arm 318 that extends into the interior of device 100. A center bias spring 316 applies force to actuator arm 318 such that a snapping action occurs when switch 310 is toggled between the ON and OFF switch positions. Actuator arm 318 is also coupled to pivot member 320. Pivot member 320 rotates in cradle member 322 under the guidance of actuator arm 318.

Figure 16:
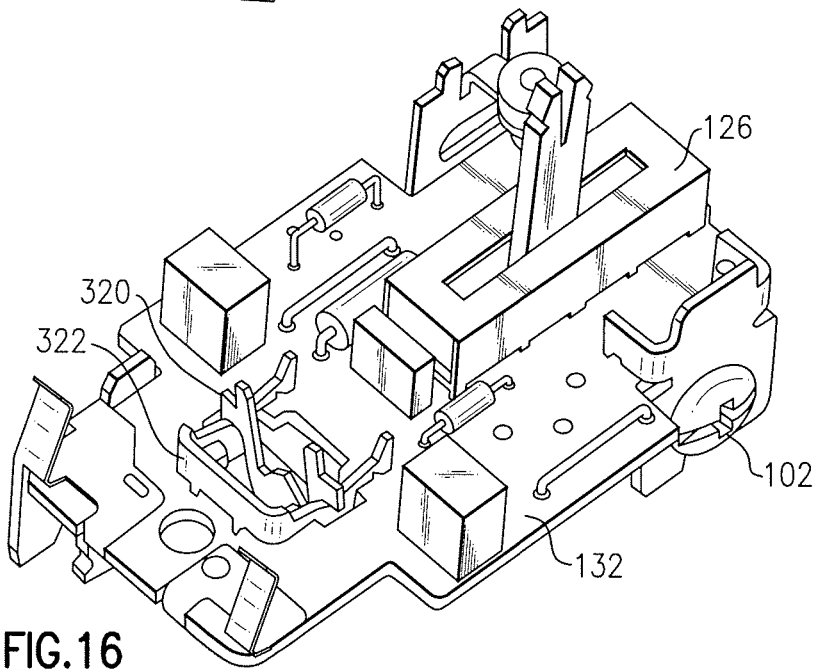
FIG. 16 is a perspective view of a portion of the printed circuit board assembly depicted in FIG. 15.

Referring to FIG. 16, a detail perspective view of the printed circuit board assembly employed in the embodiment of FIG. 11A. FIG. 16 shows in pivot member 320 disposed in the cradle member 322. Cradle member 322 is fastened to printed circuit board 132. Cradle member 322 allows pivot member 320 to rotate the switch between the ON/OFF positions. Pivot member 320 and cradle member 322 are electrically conductive. The terminal 102 may be connected to the cradle by way of a printed circuit board trace.

The printed circuit board 132 also accommodates most of the other electrically active components in device 100 including potentiometer 126, switch 128, the series pass element Q1, and electrical components coupled to the series pass element. Other electrical components mounted to the circuit board 132 include surface mount components disposed on one or both sides of printed circuit board 132, and/or leaded (through hole) components.

Figure 17:
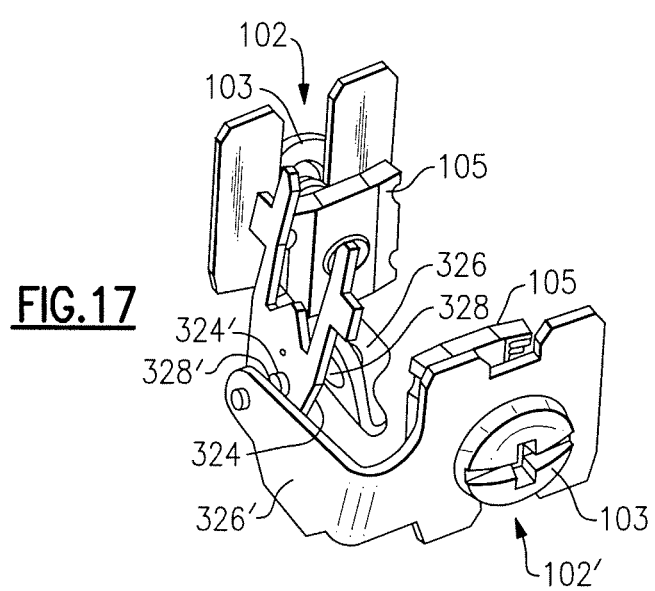
FIG. 17 is a detail view of the paddle switch mechanism depicted in FIG. 15.

FIG. 17 is a detail view of the paddle switch mechanism shown in FIG. 16 is disclosed. In particular, FIG. 17 shows the connectivity between pivot member 320 and the terminals 102. While pivot 320 is disposed within the device body, the terminal members 102, 102' and/or pressure plates 105 are disposed on either side of device 100 and accessible to the user. Each of the terminals 102, 102' include arms 326, 326' that extend perpendicularly into the interior of device 100. Each arm 326, 326' includes a fixed contact 328, 328' that is aligned with a movable contact 324, 324' disposed on pivot member 320. Of course, contact 324 is hidden behind member 320 in the view provided by FIG. 17. Pivot member 320 rotates between arm 326 and arm 326' depending on which raised surface 302, 302' on switch 300 is depressed.

Electrical contacts (324, 328) may not be necessary for pre-set switches since they are typically rated about 8 Amperes or less. Electrical connectivity between the common terminal and one or the other of the stationary terminals relies on contact between a surface of one or the other arm 326 and pivot member 322. Such surfaces may be plated surfaces, e.g. plated silver surfaces.

Reference is also made to U.S. patent application Ser. No. 10/726,128 and U.S. patent application Ser. No. 11/058,865, which are incorporated herein by reference as though fully set forth in its entirety, for a detailed explanation of alternate switch subassembly embodiments.

Figure 18:
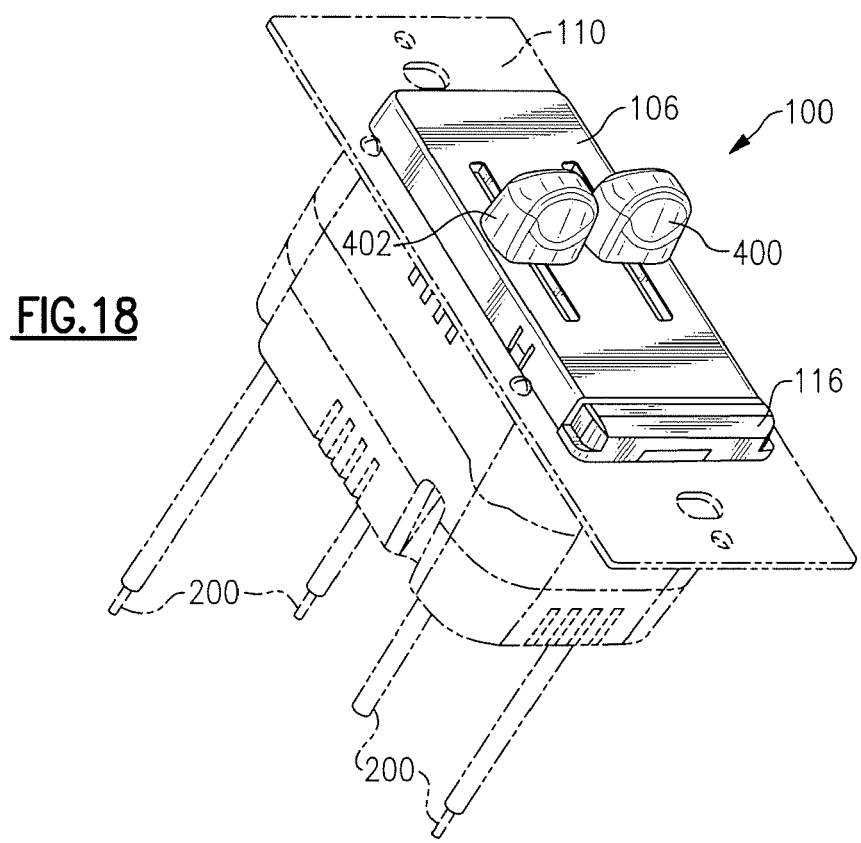
FIG. 18 is a perspective view of a power control device in accordance with a fourth embodiment of the present invention.

As embodied herein and depicted in FIG. 18, a perspective view of a fourth embodiment of the present invention is shown. Device 100 includes two independently operable control knobs 400, 402. Thus, power control device 100 may be employed to operate two dimmers, a fan speed control and a dimmer, a heating control and a dimmer, among other combinations. Device 100 may be equipped with two triacs thermally coupled to heat sink 110.

Figure 19:
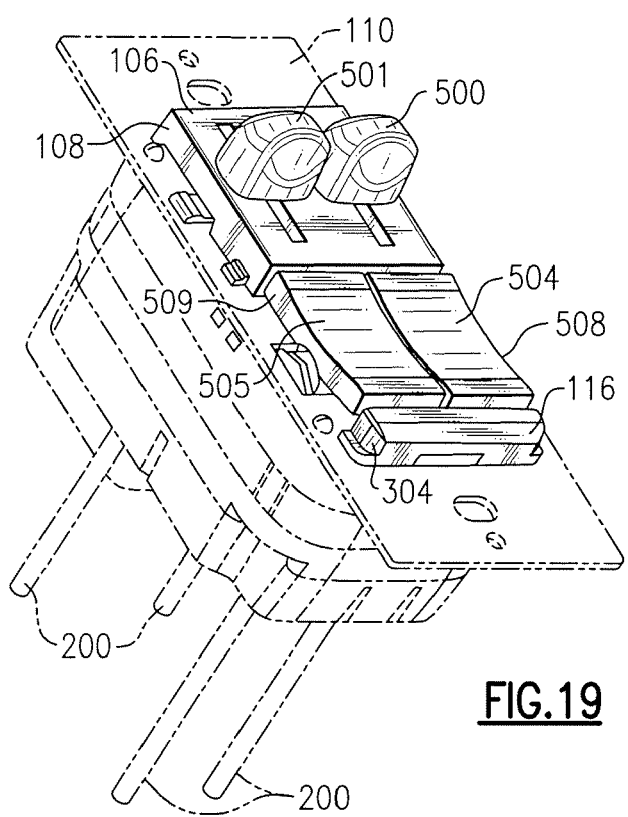
FIG. 19 is a perspective view of a power control device in accordance with a fifth embodiment of the present invention.

As embodied herein and depicted in FIG. 19, a perspective view of a fifth embodiment of the present invention is shown. In this embodiment, device 100 includes two sets of power controls. The first set includes adjustable control knob 500 and its corresponding preset switch 504. The second combination includes control knob 501 and its corresponding preset switch 505. In one embodiment, control knob 500 is configured as be actuated between multiple discrete positions. For example, control knob 500 may be moved between three fan speeds. Of course, those of ordinary skill in the art will understand that switch 500 may also be configured as a five speed control mechanism. Paddle switch 504 is the preset switch and is actuated between the ON and the OFF position. Control knob 501 may be employed as a control mechanism for a continuously variable dimmer switch. Corresponding paddle switch 505 is also a preset switch and turns the dimmer circuit ON/OFF. Those of ordinary skill in the art will understand that device 100 may be suitable for controlling two dimmers, a fan speed control and a dimmer, a heating control and a dimmer, or other such device combinations and pairings. In one embodiment, device 100 is equipped with two triacs thermally coupled to heat sink 110.

In another embodiment of the present invention, paddle switches 504 and 505 are decoupled from control knobs 500 and 501, respectively. Thus, device 100 may be configured to control two, three, or four individual electrical loads depending on whether the paddles switches (504, 505) are placed in series with their corresponding variably adjustable switch (500, 501). As used herein, the term "general purpose switch" is used to described a switch that is coupled to an electrical load that is not coupled to the power controller. A power control device may include one or more of general purpose switches, preset switches, or control switches. These switch types may also be employed in combination as required.

This embodiment is also equipped with either a light module, a removable light module, or a blank member, each designated as reference element 116 in the Figures. The raised form factor of module 116, switches 504, 505, and switch cover 106 are configured to provide an alignment during cover plate installation in the manner previously described.

Figure 20:
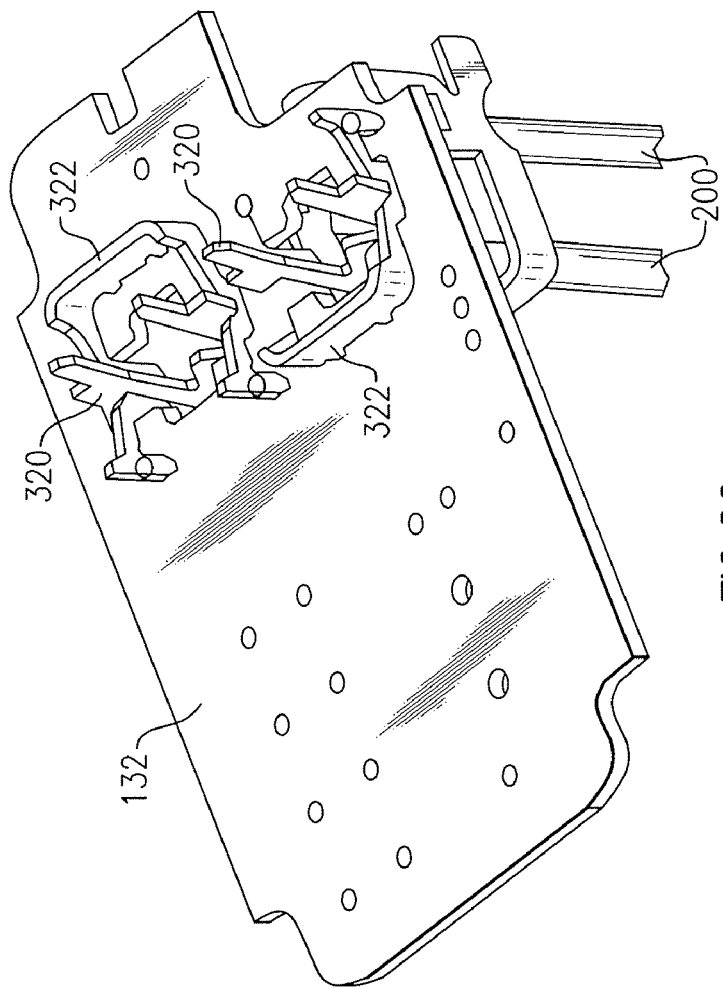
FIG. 20 is a detail view of the paddle switch mechanism depicted in FIG. 19.
Figure 21:
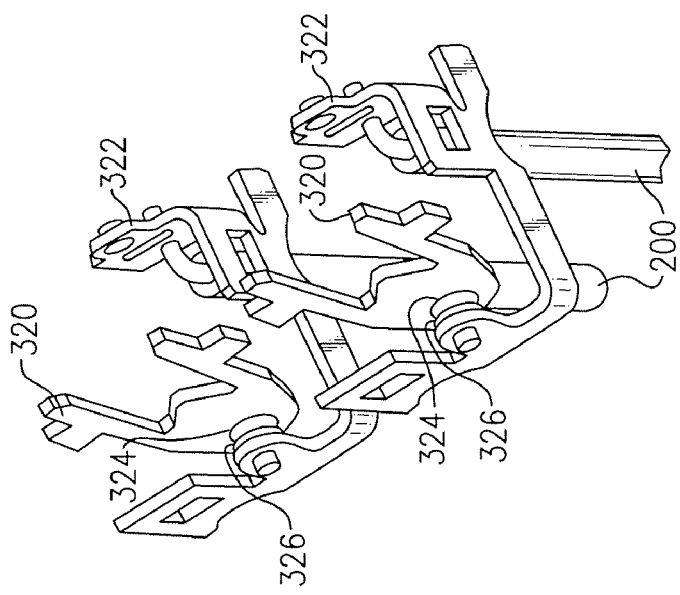
FIG. 21 is a perspective view of a portion of the printed circuit board assembly depicted in FIG. 20.

FIGS. 20-21 are detail views of the dual switch embodiment depicted in FIG. 19. In this embodiment there is only a single stationary terminal associated with each switch, i.e., both switches are on-off (single pole-single throw) switches. The switch is connected to a circuit during installation by way of wire leads 200 instead of by way of screw terminals. In an alternate embodiment (not shown) pivot members 320 are disposed within a single, unified cradle 322'. The terminal connected to the unified cradle is common to the two switches. In an alternate embodiment, at least one of the switches is a three-way switch.

Figure 22:
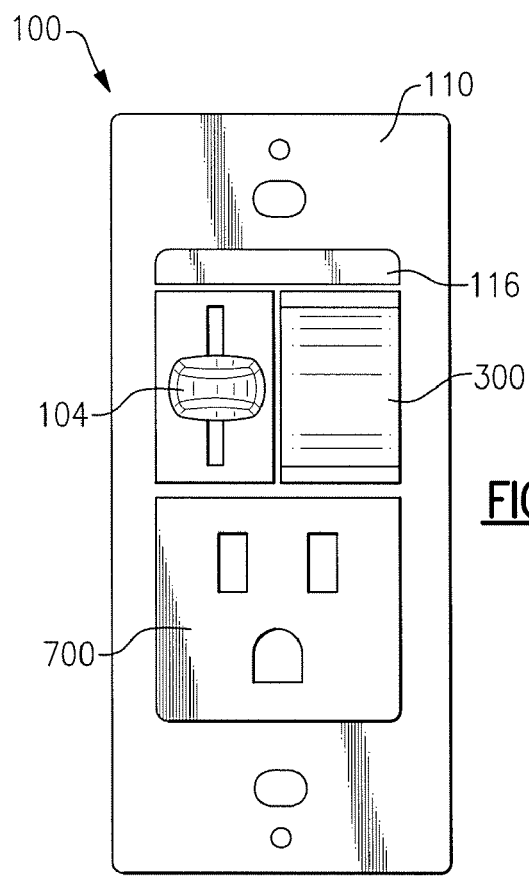
FIG. 22 is a plan view of a power control device in accordance with a sixth embodiment of the of the present invention.

As embodied herein and depicted in FIG. 22, a plan view of a sixth embodiment of the power control device of the present invention is shown. This embodiment is similar to previous embodiments, except that a receptacle outlet 700 is included in the lower portion of the device 100. Receptacle outlet 700 is coupled to the source voltage. Receptacle outlet 700 includes electrical contacts configured to permit electrical engagement of a plug by a user that in turn provides power to a user attachable load. Switch 300 may be wired as a preset switch, a switch wired to an independent load, or as a switch in series with the receptacle outlet 700. Modular lamp assembly 116 is included in device 100. As mentioned above, module 116 may be configured as a pilot light, a locator light, a night light, or to perform any of the other previously described light module functions.

Figure 23:
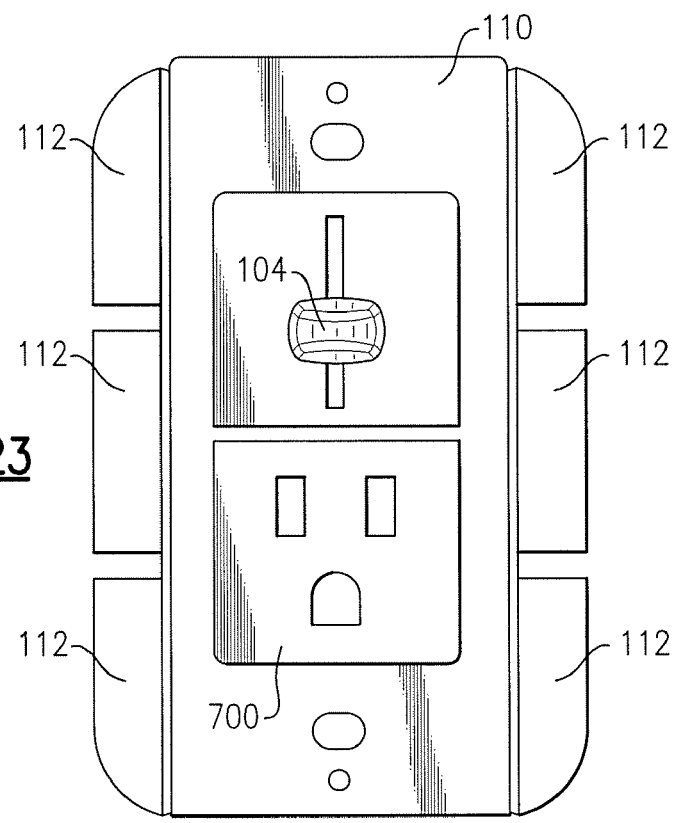
FIG. 23 is a plan view of a power control device in accordance with a seventh embodiment of the of the present invention.

Referring to FIG. 23, a plan view of a seventh embodiment of the power control device of the present invention is shown. This embodiment is similar to the embodiment shown in FIG. 18 except that switch 300 and modular lamp assembly 116 have been omitted and heat sink tabs 112 have been included.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A device for adjustably providing power to at least one electrical load, the device comprising:
   a rear body member;
   a plurality of terminals configured to be coupled to a source of the power and at least one load;
   a power control circuit disposed in the body member and coupled between the plurality of terminals and the at least one electrical load, the power control circuit including at least one variable control mechanism coupled to at least one series pass element, the at least one series pass element being configured to provide power to the at least one electrical load in accordance with the at least one variable control mechanism setting;
   a front cover assembly connected to the body member, the front cover assembly including at least one switch mechanism coupled to the at least one variable control mechanism;
   a heat sink disposed between the front cover assembly and the rear body member; and
   a ground tab connected to the heat sink by a fastener and configured to extend in a direction substantially normal to an interior planar surface of the heat sink into the rear body member, the ground tab having a higher thermal resistance per unit width than the heat sink, the ground tab including a ground terminal configured to accommodate a ground screw.

2. The device of claim 1, wherein the heat sink has a thickness greater than or equal to 0.080 inches.

3. The device of claim 2, wherein the thickness is within a range between 0.080 inches and 0.10 inches.

4. The device of claim 1, wherein a distance between the heat sink and an exterior surface of the rear body member is less than or equal to approximately 1.20 inches.

5. The device of claim 1, wherein the heat sink is characterized by a central longitudinal axis, the heat sink including at least one break away tab connected along a peripheral edge of the heat sink parallel to the central longitudinal axis.

6. The device of claim 5, wherein the at least one break away tab includes a plurality of break away tabs separated by a gap extending in a transverse direction relative to the central longitudinal axis.

7. The device of claim 6, wherein the plurality of break away tabs includes three segmented break away tabs disposed on each longitudinal peripheral edge of the heat sink, each break away tab being separated from an adjacent break away tab by a gap extending in a transverse direction relative to the central longitudinal axis.

8. The device of claim 5, wherein at least a portion of the peripheral edge connecting the at least one break away tab to the heat sink is less than the heat sink thickness.

9. The device of claim 5, wherein the peripheral edge connecting the at least one break away tab to the heat sink is perforated.

10. The device of claim 5, wherein the peripheral edge connecting the at least one break away tab to the heat sink is scored.

11. The device of claim 1, wherein a ground tab thermal conductivity is less than a heat sink thermal conductivity.

12. The device of claim 1, wherein the ground tab is comprised of a first material and the heat sink is comprised of a second material.

13. The device of claim 12, wherein the first material is steel and the second metallic material is aluminum.

14. The device of claim 1, wherein the ground tab is connected to the heat sink by the fastener using a process that is selected from a group of processes that includes riveting, welding, braising, soldering, gluing, interference fitting, and press-fitting.

15. The device of claim 1, wherein the ground tab is plated, anodized or black anodized.

16. The device of claim 1, wherein the heat sink is plated, anodized or black anodized.

17. The device of claim 1, wherein the power control circuit includes a control circuit coupled to the series pass element, the control circuit being configured to cycle the series pass element between an ON position and an OFF position a predetermined number of times during each AC cycle in accordance with the at least one adjustable switching mechanism switch setting.

18. The device of claim 17, wherein the control circuit includes an RFI noise suppression circuit.

19. The device of claim 18, wherein the RFI noise suppression circuit includes at least one inductor and at least one capacitor.

20. The device of claim 1, wherein the at least one series pass element includes a solid state device.

21. The device of claim 20, wherein the solid state device includes a thyristor.

22. The device of claim 20, wherein the solid state device includes a triac.

23. The device of claim 1, wherein the at least one variable control mechanism includes a continuously variable potentiometer.

24. The device of claim 1, wherein the at least one variable control mechanism includes a multiple position switch element configured to drive the series pass element between multiple discrete power settings.

25. The device of claim 24, wherein multiple position switch element is configured to switch between a plurality of capacitors when driving the series pass element between multiple discrete power settings.

26. The device of claim 1, wherein the plurality of terminals include screw terminals.

27. The device of claim 1, wherein the plurality of terminals include wire terminals.

28. The device of claim 1, wherein the at least one electrical load includes a fan motor.

29. The device of claim 1, wherein the at least one electrical load includes a lamp.

30. The device of claim 1, wherein the at least one switch mechanism includes at least one user variable slide switch assembly configured to adjust the variable control mechanism.

31. The device of claim 30, wherein the user variable slide switch assembly includes a continuously variable switch.

32. The device of claim 30, wherein the user variable slide switch assembly includes a multi-position switch.

33. The device of claim 30, wherein the at least one user variable slide switch assembly is characterized by a longitudinal dimension substantially equal to the longitudinal dimension of a standard wall plate opening.

34. The device of claim 30, wherein the frameless front cover assembly further comprises a modular lamp assembly coupled to the user variable slide switch assembly, the at least one user variable slide switch assembly and the modular lamp assembly in combination being characterized by a longitudinal dimension substantially equal to the longitudinal dimension of a standard wall plate opening.

35. The device of claim 30, wherein the at least one switch mechanism includes at least one control switch coupled to the at least one user variable slide switch assembly.

36. The device of claim 1, wherein the frameless front cover assembly includes at least one user variable slide switch assembly configured to adjust the at least one variable control mechanism and at least one toggle switch assembly coupled to the plurality of terminals.

37. The device of claim 36, wherein the at least one toggle switch assembly includes a preset switch coupled to the at least one user variable slide switch assembly, the preset switch being configured to turn the at least one user variable slide switch assembly between an ON state and an OFF state.

38. The device of claim 36, wherein the at least one user variable slide switch assembly and the at least one toggle switch assembly in combination are characterized by a longitudinal dimension substantially equal to the longitudinal dimension of a standard wall plate opening.

39. The device of claim 36, wherein the at least one toggle switch assembly includes at least one general purpose switch.

40. The device of claim 1, wherein the front cover assembly further comprises:
   at least one user variable slide switch assembly configured to adjust the at least one variable control mechanism;
   at least one toggle switch assembly coupled to the plurality of terminals and disposed in longitudinal alignment with the at least one user variable slide switch assembly; and
   a modular lamp assembly coupled to the user variable slide switch assembly and disposed in longitudinal alignment with the at least one toggle switch assembly, the at least one variable switch, and the modular lamp assembly in combination being characterized by a longitudinal dimension substantially equal to the longitudinal dimension of a standard wall plate opening.

41. The device of claim 1, wherein the front cover assembly is a frameless front cover assembly having a raised rectangular form factor substantially conforming to a standard wall plate opening.

42. The device of claim 1, wherein the heat sink is a planar heat sink.

43. A device for adjustably providing power to at least one electrical load, the device comprising:
   a rear body member;
   a plurality of terminals configured to be coupled to a source of the power and at least one load;
   a power control circuit disposed in the body member and coupled between the plurality of terminals and the at least one electrical load, the power control circuit including at least one variable control mechanism coupled to at least one series pass element, the at least one series pass element being configured to provide power to the at least one electrical load in accordance with the at least one variable control mechanism setting; and a front cover assembly connected to the body member, the front cover assembly including at least one switch mechanism coupled to the at least one variable control mechanism and a modular lamp assembly;

a heat sink disposed between the front cover assembly and the rear body member; and a ground tab connected to the heat sink by a fastener and configured to extend in a direction substantially normal to an interior planar surface of the heat sink into the rear body member, the ground tab having a higher thermal resistance per unit width than the heat sink, the ground tab including a ground terminal configured to accommodate a ground screw.

44. The device of claim 43, wherein the modular lamp assembly includes a locator light.

45. The device of claim 43, wherein the modular lamp assembly includes a pilot light.

46. The device of claim 43, wherein the modular lamp assembly includes a night light.

47. The device of claim 43, wherein the front cover assembly is a frameless front cover assembly having a raised rectangular form factor substantially conforming to a standard wall plate opening.

48. The device of claim 43, wherein the heat sink is a planar heat sink.

* * * * *